United States Patent
Huang

(10) Patent No.: US 8,721,924 B2
(45) Date of Patent: May 13, 2014

(54) WHITE LIGHT EMITTING DEVICES UTILIZING PHOSPHORS

(75) Inventor: Tien-Heng Huang, Tainan (TW)

(73) Assignee: Industrial Technology Research Institute, Hsinchu (TW)

(*) Notice: Subject to any disclaimer, the term of this patent is extended or adjusted under 35 U.S.C. 154(b) by 228 days.

(21) Appl. No.: 13/288,773

(22) Filed: Nov. 3, 2011

(65) Prior Publication Data

US 2013/0057139 A1   Mar. 7, 2013

(30) Foreign Application Priority Data

Sep. 6, 2011   (TW) .............................. 100132035 A

(51) Int. Cl.
*H01L 33/50* (2010.01)
*C09K 11/66* (2006.01)
*C09K 11/59* (2006.01)

(52) U.S. Cl.
USPC .................. 252/301.4 F; 313/503; 257/98

(58) Field of Classification Search
USPC ................... 252/301.4 F; 313/503; 257/98
See application file for complete search history.

(56) References Cited

U.S. PATENT DOCUMENTS

| | | | |
|---|---|---|---|
| 4,839,226 A | 6/1989 | Sawada et al. | |
| 4,957,604 A | 9/1990 | Steininger | |
| 6,828,719 B1 | 12/2004 | Huang et al. | |
| 6,841,932 B2 | 1/2005 | Aziz et al. | |
| 7,135,699 B1 | 11/2006 | Atanackovic | |
| 7,531,596 B2 | 5/2009 | Sandstrom | |
| 7,531,956 B2 | 5/2009 | Kim et al. | |
| 7,648,650 B2 | 1/2010 | Liu et al. | |
| 7,655,156 B2 | 2/2010 | Cheng et al. | |
| 7,965,036 B2 | 6/2011 | Yun et al. | |
| 2004/0053460 A1 | 3/2004 | Higuchi et al. | |
| 2004/0232819 A1 | 11/2004 | Huang et al. | |
| 2007/0159067 A1 | 7/2007 | Yun et al. | |
| 2007/0170840 A1 | 7/2007 | Chang-Hae et al. | |
| 2008/0231166 A1 | 9/2008 | Su | |
| 2009/0289546 A1 | 11/2009 | Igarashi et al. | |

FOREIGN PATENT DOCUMENTS

| | | | |
|---|---|---|---|
| CN | 101124295 A | | 2/2008 |
| CN | 101864302 | * | 10/2010 |
| CN | 101864302 A | | 10/2010 |
| EP | 1666563 A1 | | 6/2006 |
| JP | 2006-036943 | | 9/2006 |
| JP | 2007297643 A | | 11/2007 |
| TW | 200948933 A1 | | 12/2009 |
| WO | WO-2011/078464 A1 | | 6/2011 |

OTHER PUBLICATIONS

Translation for CN 10186430, Oct. 20, 2010.*

(Continued)

*Primary Examiner* — Carol M Koslow
(74) *Attorney, Agent, or Firm* — Muncy, Geissler, Olds & Lowe, P.C.

(57) ABSTRACT

Disclosed is a phosphor having a formula of $(Sr_{1-a-b-c}M_a Tm_b Eu_c)_3 Si_{1-d} Ge_d O_5$. Sr, M, Tm, and Eu are divalent metal ions, and M is selected from Ca, Ba, Mg, or combinations thereof. Si and Ge are tetravalent ions. $0 \leq a \leq 0.5$, $0 \leq b \leq 0.03$, $0 < c \leq 0.1$, and $0 < d \leq 0.005$. The phosphor can be collocated with a yellow phosphor and a blue light excitation source to complete a warm white light emitting device.

5 Claims, 7 Drawing Sheets

(56) References Cited

OTHER PUBLICATIONS

Park et al., "Embodiment of the Warm White-Light-Emitting Diodes by Using a $Ba^{2+}$ codoped $Sr_3SiO_5$ : Eu Phosphor" Applied Physics Letters, (Jan. 27, 2006), pp. 043511-1-043511-3, vol. 88, 043511.

Jang et al., "Emission Band Change of $(Sr_{1-x}M_x)_3SiO_5$:$Eu^{2+}$ (M=Ca, Ba) Phosphor For White Light Sources Using Blue/Near-Ultraviolet LEDs", Journal of the Electrochemical Society, (Apr. 6, 2009), pp. J138-J142, vol. 156 (6).

Im et al., "$La_{1-x-0.025}Ce_{0.025}Sr_{2+x}Al_{1-x}Si_xO_5$ Solid Solutions as Tunable Yellow Phosphors for Solid State White Lighting" Journal of Materials Chemistry, (Jan. 26, 2009) pp. 1325-1330, vol. 19.

Jee et al., "Photoluminescence Properties of $Eu^{2+}$-activated $Sr_3SiO_5$ Phosphors", Journal of Materials Science, (Mar. 10, 2006), pp. 3139-3141., vol. 41.

\* cited by examiner

WHITE LIGHT EMITTING DEVICES UTILIZING PHOSPHORS

CROSS REFERENCE TO RELATED APPLICATIONS

This Application claims priority of Taiwan Patent Application No. 100132035, filed on Sep. 6, 2011, the entirety of which is incorporated by reference herein.

BACKGROUND OF THE INVENTION

1. Field of the Invention

The disclosure relates to a phosphor, and in particular relates to a white light emitting device utilizing the same.

2. Description of the Related Art

Use of white light emitting diodes is a major trend in modern illumination due to the energy-saving, low pollution, and long lifetime thereof. The critical points for total luminous efficiency in the illumination devices are not only the inherent brightness of LEDs but also the LED phosphors used.

The general commercially available white light LED is a blue LED (emission wavelength of 460 nm to 480 nm) collocated with a yellow phosphor, which has poor color-rendering due to the lack of red light. In other words, a white light LED utilizing a combination of red and yellow phosphors have better color rendering than the white light LED only utilizing the yellow phosphor. However, the major commercially available blue light excitable red phosphors are nitrides or sulfides, which have an emission wavelength of 620 nm to 650 nm. The red phosphors of nitride have high stability, but need expensive starting materials (e.g. strontium nitride and barium nitride) and expensive processes (e.g. high temperature and high pressure) for fabrication thereof. The cost of the red phosphor of sulfide is low, but it is not suitable for application in LEDs due to low chemical stability thereof. Recently, an orange red phosphor of silicate has been used to collocate with a yellow phosphor and blue LED to complete a white light LED with high color rendering. The usual orange red phosphor of silicate is $(CaSr)_2SiO_4:Eu^{2+}$ (BOS600) and has an emission spectrum of 580 nm to 600 nm, a relatively low cost, good illumination efficiency, and better chemical stability than the red phosphor of sulfide. However, the thermal stability of BOS600 is not sufficient. Accordingly, an orange red phosphor having good illumination efficiency, a low cost, and excellent thermal stability is called-for.

BRIEF SUMMARY OF THE INVENTION

One embodiment of the disclosure provides a phosphor, having a formula: $(Sr_{1-a-b-c}M_aTm_bEu_c)_3Si_{1-d}Ge_dO_5$, wherein Sr, M, Tm, and Eu are divalent metal ions, and M is selected from Ca, Ba, Mg, or combinations thereof, and Si and Ge are tetravalent ions, and $0 \leq a \leq 0.5$, $0 \leq b \leq 0.03$, $0 < c \leq 0.1$, and $0 < d \leq 0.005$.

One embodiment of the disclosure provides a white light emitting device, comprising: a blue light excitation source; and a yellow phosphor and the described phosphor.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

The disclosure provides a series of silicate phosphors as shown in Formula 1:

$$(Sr_{1-a-b-c}M_aTm_bEu_c)_3Si_{1-d}Ge_dO_5 \quad \text{(Formula 1)}$$

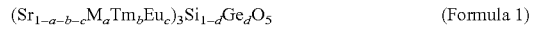

In Formula 1, Sr, M, Tm, and Eu are divalent metal ions, and M is Ca, Ba, Mg, or combinations thereof. Si and Ge are tetravalent ions. $0 \leq a \leq 0.5$, $0 \leq b \leq 0.03$, $0 < c \leq 0.1$, and $0 < d \leq 0.005$. The major mechanism thereof is doping other elements into the orange yellow phosphor $Sr_3SiO_5$ to increase its illumination efficiency.

When a and b in Formula 1 is equal to zero (a=b=0), the phosphor has a formula of $(Sr_{1-c}Eu_c)_3Si_{1-d}Ge_dO_5$, which has an emission spectrum of 580 nm±5 nm.

When a is equal to zero (a=0) and b is greater than 0 and less than or equal to 0.03 ($0<b\leq0.03$) in Formula 1, the phosphor has a formula of $(Sr_{1-b-c}Tm_bEu_c)_3Si_{1-d}Ge_dO_5$, which has an emission spectrum of 580 nm±5 nm.

When M is Ba, a is greater than or equal to 0.1 and less than or equal to 0.5 ($0.1 \leq a \leq 0.5$), b is greater than 0 and less than or equal to 0.03 ($0<b\leq0.03$), and d is greater than 0 and less than or equal to 0.005 ($0<d\leq0.005$) in Formula 1, the phosphor has a formula of $(Sr_{1-a-b-c}Ba_aTm_bEu_c)_3Si_{1-d}Ge_dO_5$, which has an emission spectrum of 600 nm±5 nm.

The phosphor can be collocated with a yellow phosphor such as $Y_3Al_5O_{12}:Ce$ (YAG), $Tb_3Al_5O_{12}:Ce$, $(BaSr)_2SiO_4:Eu$, or combinations thereof, and a blue light excitation source such as an LED or laser diode to complete a white light emitting device. In one embodiment, the white light emitting device emits a warm color white light.

In addition, the disclosure also provides a method of manufacturing the silicate phosphors. First, (1) a compound containing strontium and oxygen, (2) a compound containing silicon and oxygen, (3) a compound containing germanium and oxygen, (4) a compound containing europium and oxygen, and (5) a compound containing thulium and/or M and oxygen were mixed to obtain a mixture. The mixture is then sintered at a temperature of 1300° C. to 1600° C. When the mixture is heated to the sintering temperature, the mixture is sintered at the sintering temperature for one hour to four hours. According to the embodiments, the compounds containing oxygen can be oxides, carbonates, or nitrates.

EXAMPLES

Example 1

Figure 1A:
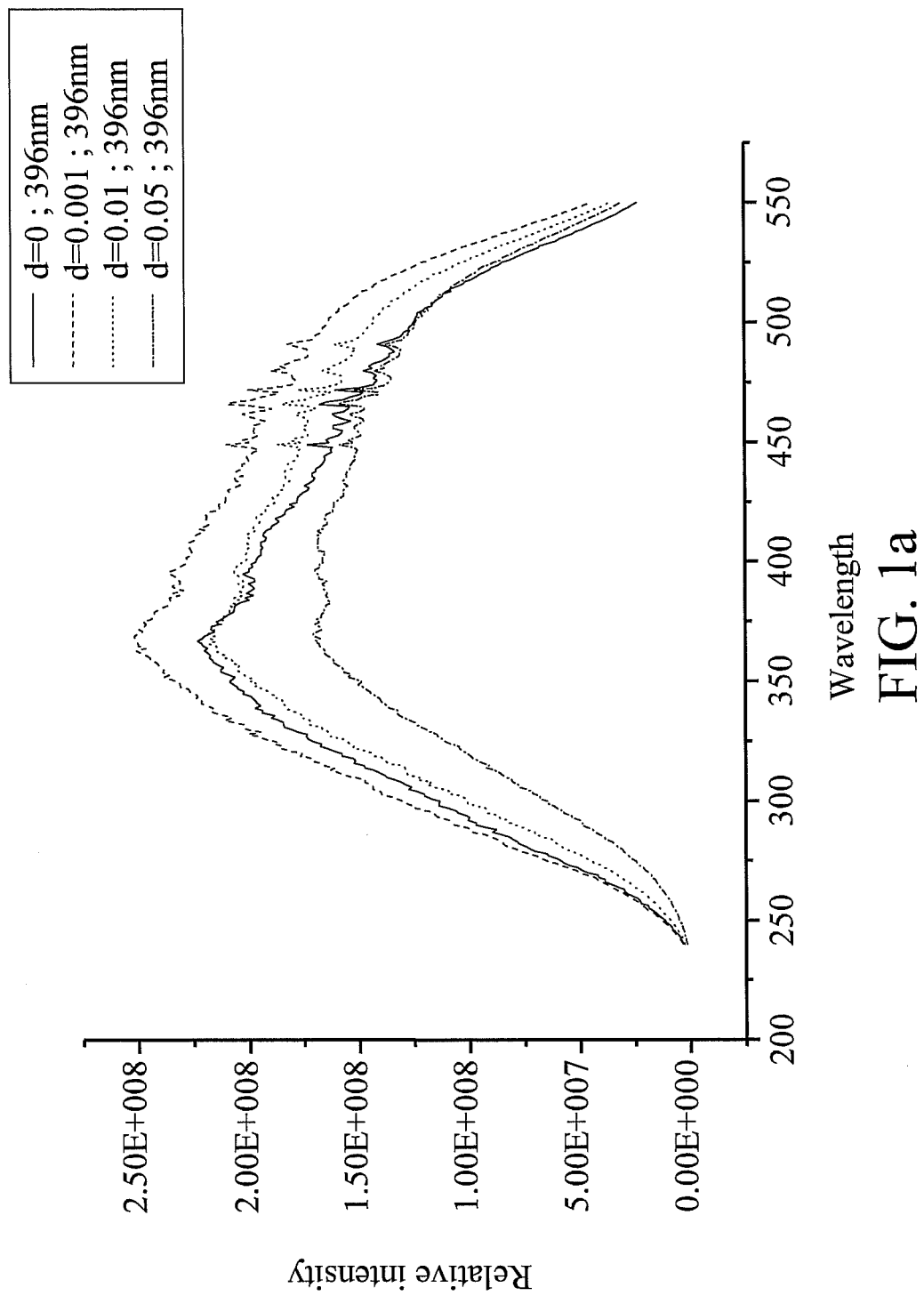
FIG. 1a shows absorption spectra of phosphors $(Sr_{0.99}Eu_{0.01})_3Si_{1-d}Ge_dO_5$ of different Si/Ge ratios in one embodiment of the disclosure.
Figure 1B:
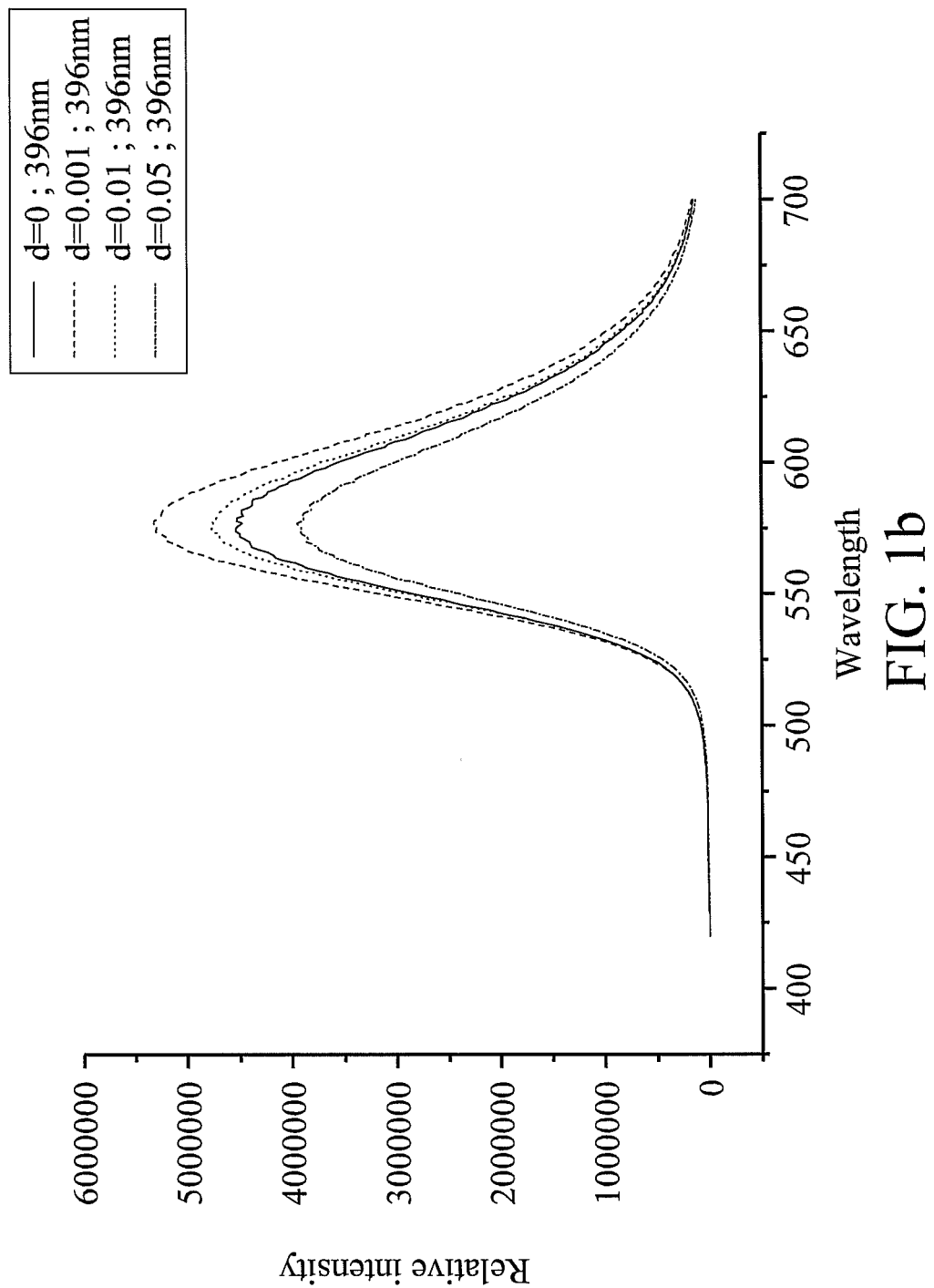
FIG. 1b shows emission spectra of phosphors $(Sr_{0.99}Eu_{0.01})_3Si_{1-d}Ge_dO_5$ of different Si/Ge ratios in one embodiment of the disclosure.

According to molar ratios of $(Sr_{0.99}Eu_{0.01})_3Si_{1-d}Ge_dO_5$, wherein d was 0, 0.001, 0.01, and 0.05, respectively, appropriate stoichiometry of SrO, EuO, $SiO_2$, and $GeO_2$ were evenly mixed and grinded for ten minutes, and charged in a crucible. The crucible was then heated in a high temperature furnace. After sintering at 1300° C.-1600° C. under a gas mixture (5% $H_2$/95% $N_2$) for 1-4 hours, the silicate phosphors $(Sr_{0.99}Eu_{0.01})_3Si_{1-d}Ge_dO_5$ of different Si/Ge ratios were prepared. FIG. 1a shows absorption spectra of phosphors $(Sr_{0.99}Eu_{0.01})_3Si_{1-d}Ge_dO_5$ of different Si/Ge ratios, and FIG. 1b shows emission spectra of phosphors $(Sr_{0.99}Eu_{0.01})_3Si_{1-d}Ge_dO_5$ of different Si/Ge ratios. When d is equal to 0 (d=0), $(Sr_{0.09}Eu_{0.01})_3SiO_5$ has an excitation spectrum of 250 nm (deep UV) to 550 nm (green light), and an emission spectrum of about 580 nm (orange yellow light). When the doping amount d of Ge is equal to 0.001 (d=0.001), the phosphor has an excitation spectrum and an emission spectrum similar to that of the phosphor without dopant Ge. However, the phosphor doped by Ge (d=0.001) has a higher illumination efficiency than the phosphor without dopant Ge. Appropriate doping amounts of d of Ge may increase the excitation efficiency of the phosphor in the long wavelength region, as shown in FIG. 1a.

Example 2

Figure 2A:
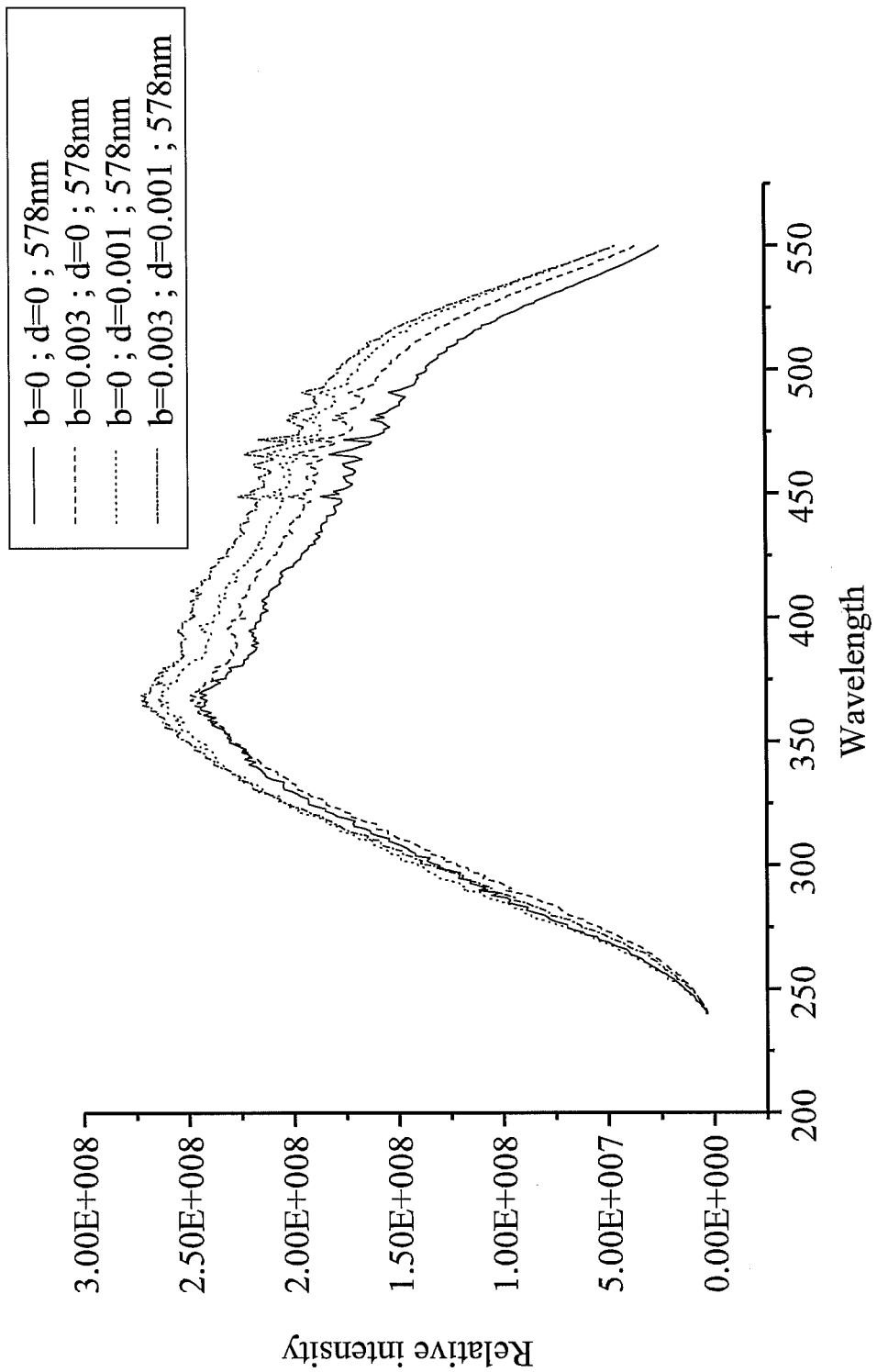
FIG. 2a shows absorption spectra of phosphors $(Sr_{0.99-b}Tm_bEu_{0.01})_3Si_{1-d}Ge_dO_5$ of different Sr/Tm ratios and different Si/Ge ratios in one embodiment of the disclosure.
Figure 2B:
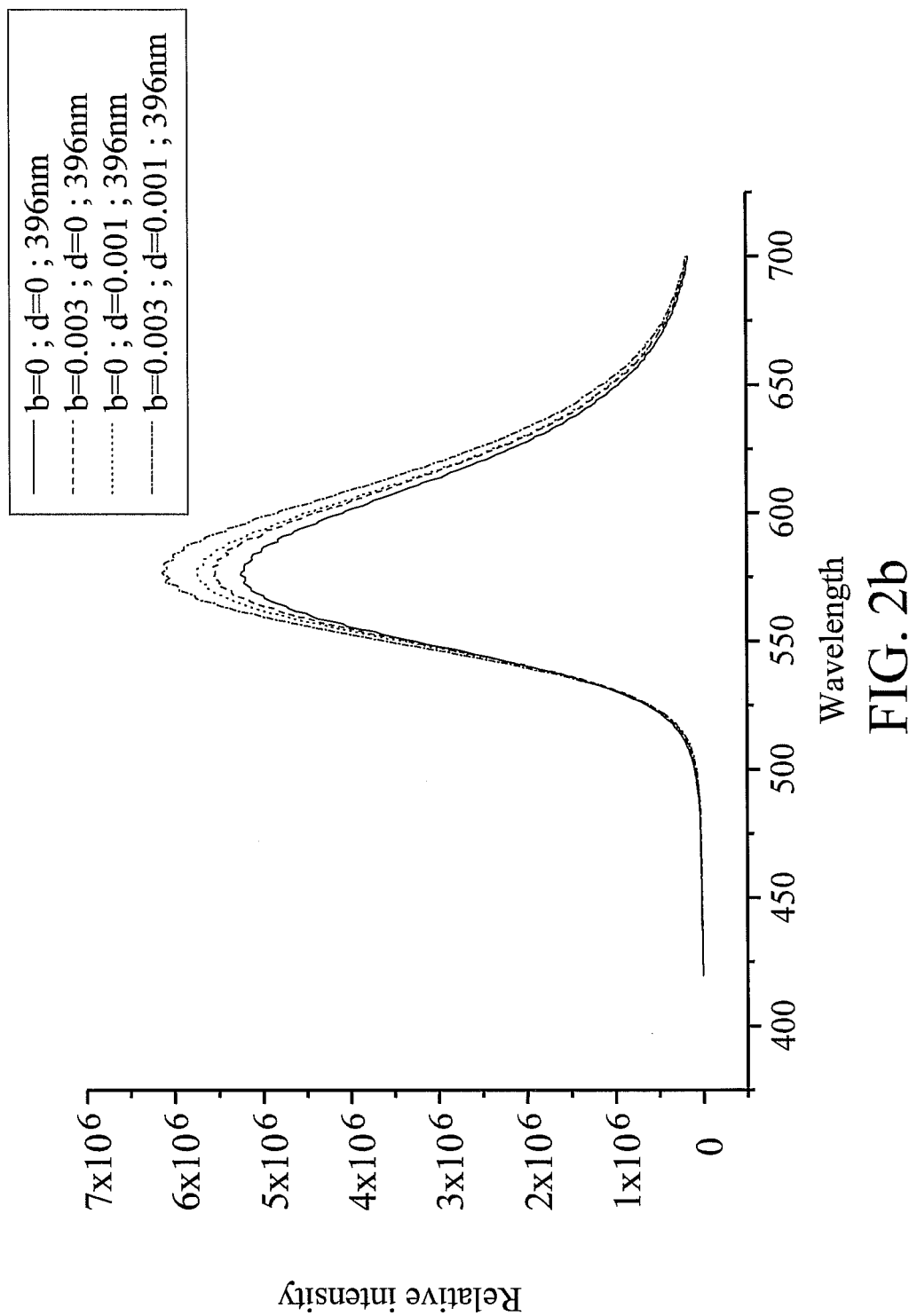
FIG. 2b shows emission spectra of phosphors $(Sr_{0.99-b}Tm_bEu_{0.01})_3Si_{1-d}Ge_dO_5$ of different Sr/Tm ratios and different Si/Ge ratios in one embodiment of the disclosure.

According to molar ratios of $(Sr_{0.99-b}Tm_bEu_{0.01})_3Si_{1-d}Ge_dO_5$, wherein (b,d) were (0, 0), (0.003, 0), (0, 0.001), and (0.003, 0.001), respectively, appropriate stoichiometry of SrO, EuO, $SiO_2$, $GeO_2$, and TmO were evenly mixed and grinded for ten minutes, and charged in a crucible. The crucible was then heated in a high temperature furnace. After sintering at 1300° C.-1600° C. under a gas mixture (5% $H_2$/95% $N_2$) for 1-4 hours, the silicate phosphors $(Sr_{0.99-b}Tm_bEu_{0.01})_3Si_{1-d}Ge_dO_5$ of different Sr/Tm ratios and different Si/Ge ratios were prepared. FIG. 2a shows absorption spectra of phosphors $(Sr_{0.99-b}Tm_bEu_{0.01})_3Si_{1-d}Ge_dO_5$ of different Sr/Tm ratios and different Si/Ge ratios, and FIG. 2b shows emission spectra of phosphors $(Sr_{0.99-b}Tm_bEu_{0.01})_3Si_{1-d}Ge_dO_5$ of different Sr/Tm ratios and different Si/Ge ratios. As shown in FIG. 2b, the illumination efficiency of the phosphor can be improved by doping Ge or Tm into the phosphor. In addition, simultaneously doping Ge and Tm into the phosphors may further improve the illumination efficiency of the phosphor.

Example 3

Figure 3:
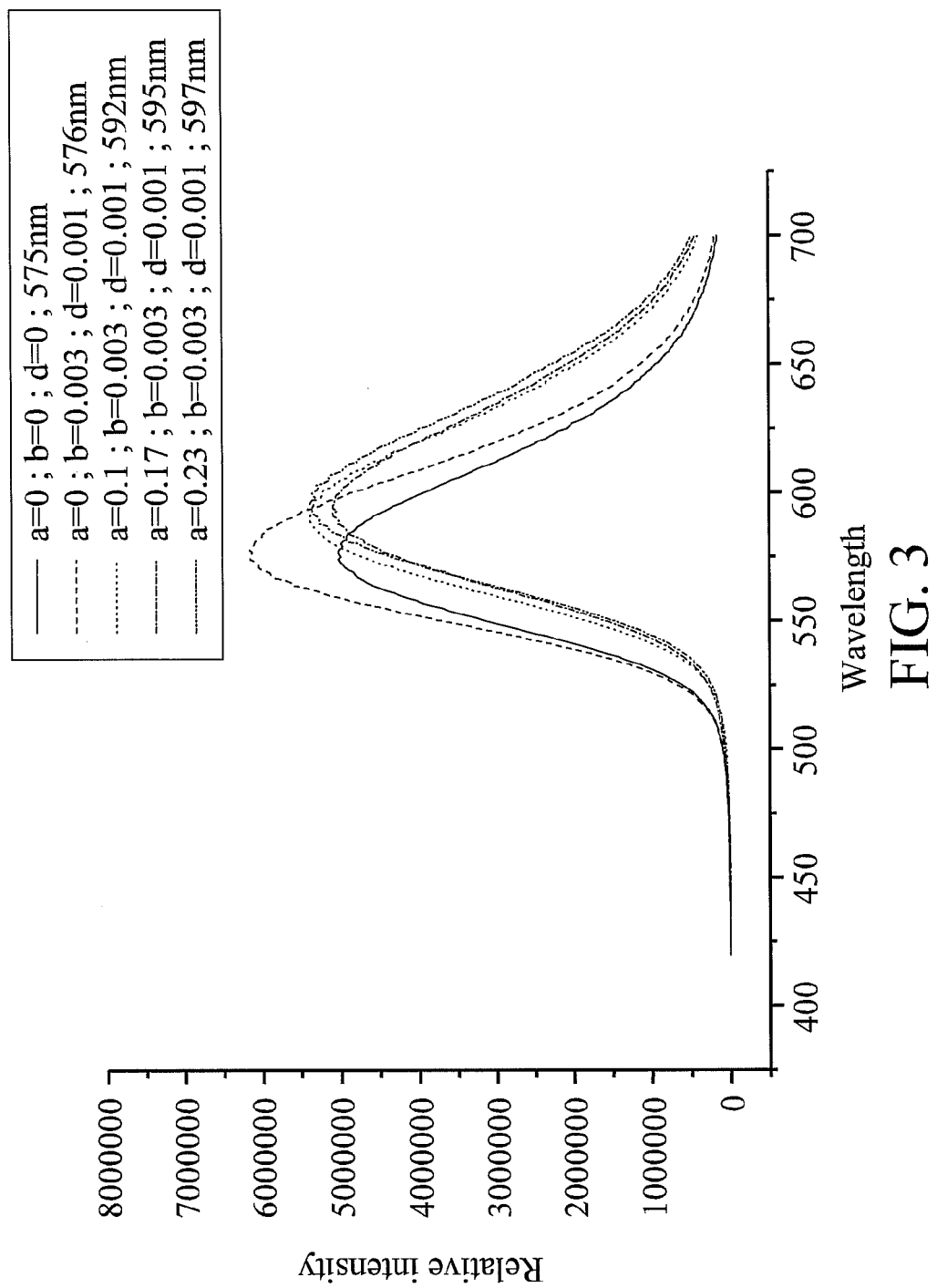
FIG. 3 shows emission spectra of phosphors $(Sr_{0.99-a-b}Ba_aTm_bEu_{0.01})_3Si_{1-d}Ge_dO_5$ of different Sr/Ba/Tm ratios and different Si/Ge ratios in one embodiment of the disclosure.

According to molar ratios of $(Sr_{0.99-a-b}Ba_aTm_bEu_{0.01})_3Si_{1-d}Ge_dO_5$, wherein (a,b,d) were (0, 0, 0), (0, 0.003, 0.001), (0.1, 0.003, 0.001), (0.17, 0.003, 0.001), and (0.23, 0.003, 0.001), respectively, appropriate stoichiometry of SrO, EuO, $SiO_2$, $GeO_2$, TmO, and BaO were evenly mixed and grinded for ten minutes, and charged in a crucible. The crucible was then heated in a high temperature furnace. After sintering at 1300° C.-1600° C. under a gas mixture (5% $H_2$/95% $N_2$) for 1-4 hours, the silicate phosphors $(Sr_{0.99-a-b}Ba_aTm_bEu_{0.01})_3Si_{1-d}Ge_dO_5$ of different Sr/Ba/Tm ratios and different Si/Ge ratios were prepared. FIG. 3 shows emission spectra of phosphors $(Sr_{0.99-a-b}Ba_aTm_bEu_{0.01})_3Si_{1-d}Ge_dO_5$ of different Sr/Ba/Tm ratios and different Si/Ge ratios.

Figure 4:
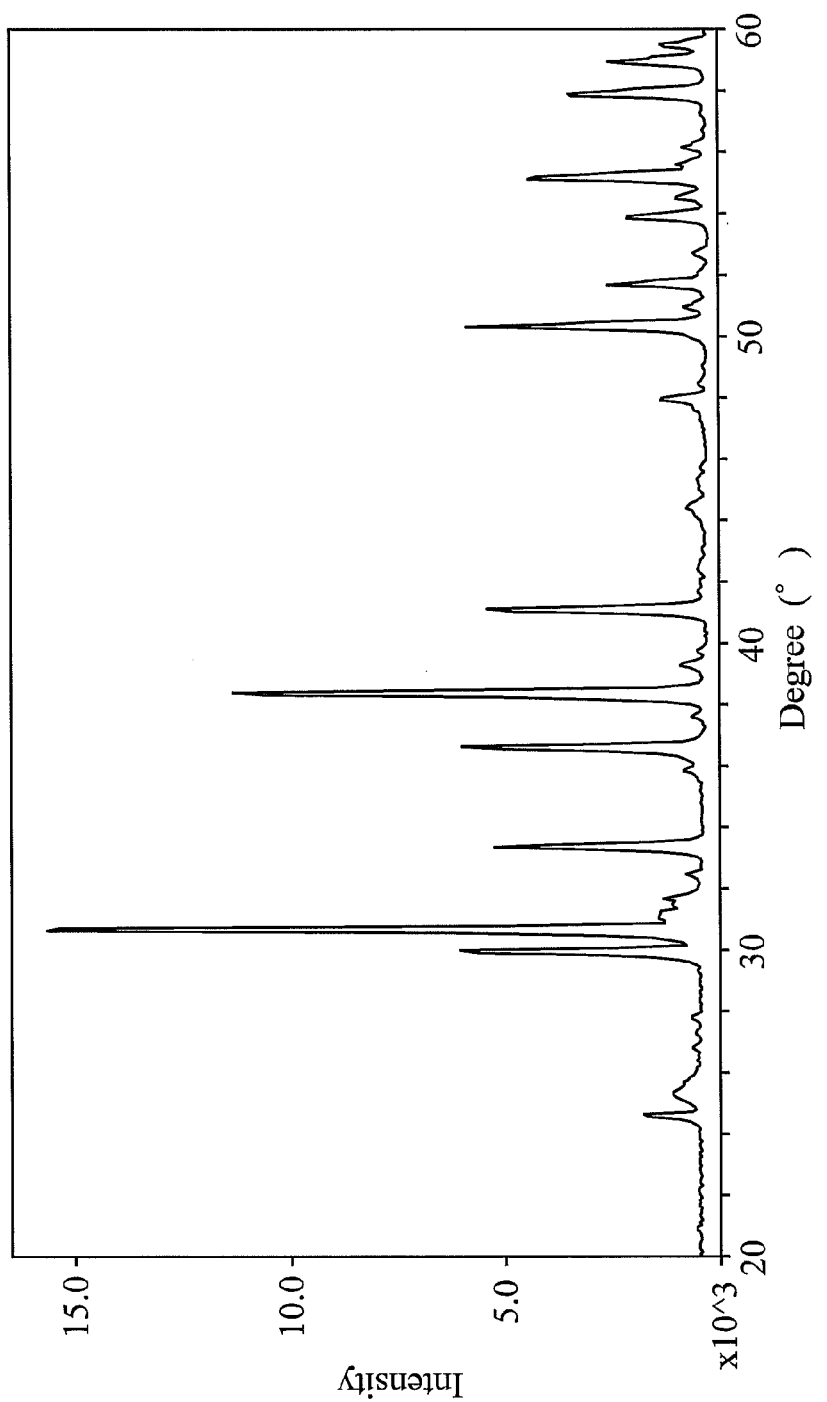
FIG. 4 shows an X-ray diffraction spectrum of a phosphor $(Sr_{0.86}Ba_{0.1}Tm_{0.003}Eu_{0.01})_3Si_{0.999}Ge_{0.001}O_5$ in one embodiment of the disclosure.
Figure 5:
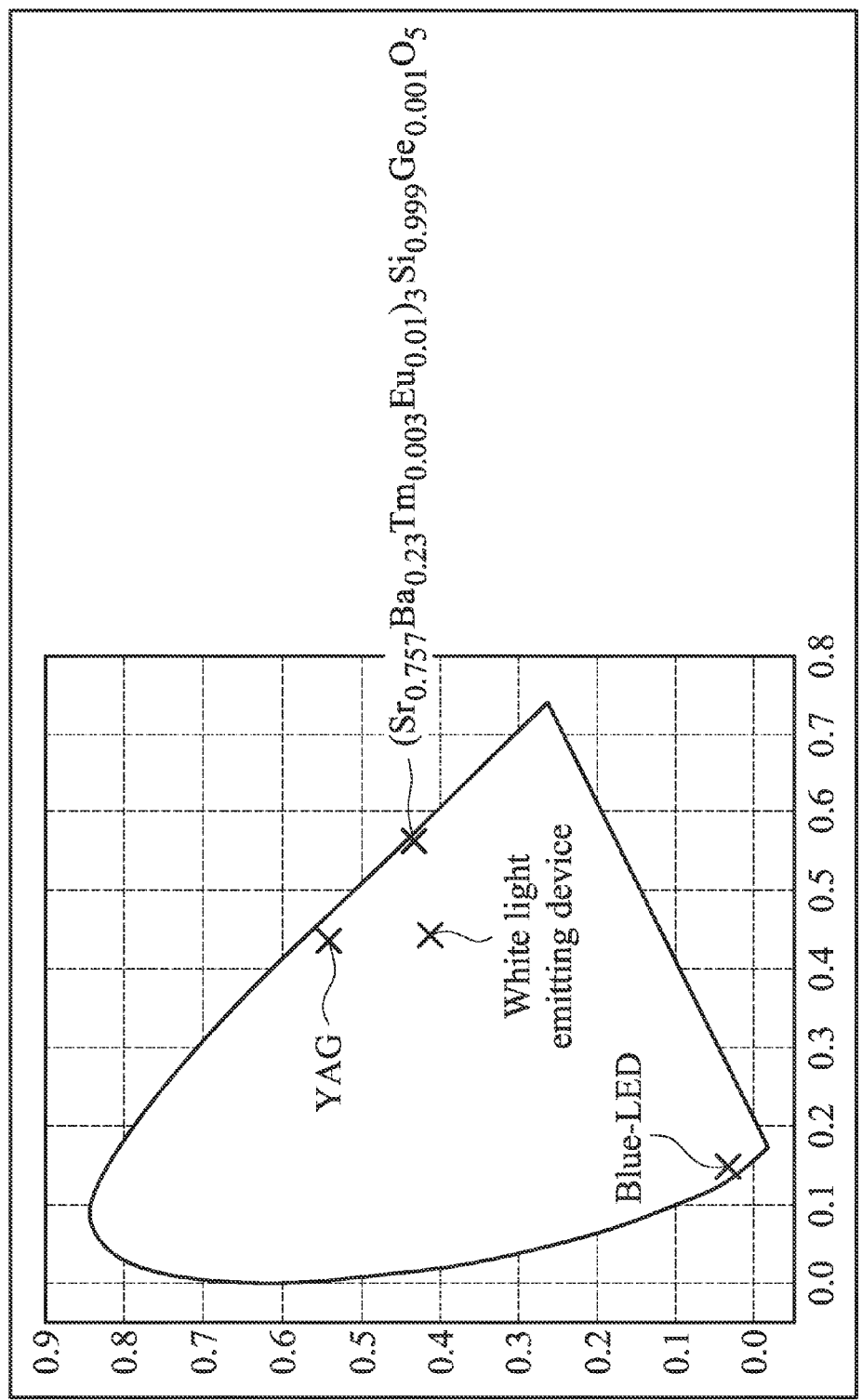
FIG. 5 shows CIE coordinates of a yellow phosphor YAG, a phosphor $(Sr_{0.757}Ba_{0.23}Tm_{0.003}Eu_{0.01})_3Si_{0.999}Ge_{0.001}O_5$, a blue LED, and a white light emitting device utilizing the YAG, the phosphor of the disclosure, and the blue LED.

Because the white LED utilizing a yellow phosphor excited by a blue light needs an orange red phosphor to improve its color rendering, the silicate phosphor was further doped with an alkali earth metal element Ba to shift its emission spectrum as shown in FIG. 3. Doping Tm and Ge into the phosphor may increase the illumination efficiency of the phosphor, and doping Ba into the phosphor may shift the emission spectrum of the phosphor, respectively. The phosphor without a dopant emits an orange yellow light (about 580 nm), and the phosphor doped by Ba emits an orange red light (597 nm). FIG. 4 shows an X-ray diffraction spectrum of a phosphor $(Sr_{0.86}Ba_{0.1}Tm_{0.003}Eu_{0.01})_3Si_{0.999}Ge_{0.001}O_5$. As shown in FIG. 4, only a little part of the product is the starting material $SiO_2$ phase without emitting light, and most parts of the product is composed of the $Sr_3SiO_5$ phase. Furthermore, the orange red phosphor $(Sr_{0.757}Ba_{0.23}Tm_{0.003}Eu_{0.01})_3Si_{0.999}Ge_{0.001}O_5$ was collocated with the yellow phosphor YAG and blue LED, thereby completing a white light emitting device for emitting a warm color white light of a color temperature of 3000K, as shown in FIG. 5.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A white light emitting device, comprising:
    a blue light excitation source; and
    a yellow phosphor and a phosphor having a formula:
    $(Sr_{1-a-b-c}M_aTm_bEu_c)_3Si_{1-d}Ge_dO_5$,
    wherein Sr, M, Tm, and Eu are divalent metal ions, and M is selected from Ca, Ba, Mg, or combinations thereof,
    wherein Si and Ge are tetravalent ions,
    $0 \leq a \leq 0.5$,
    $0 \leq b \leq 0.03$,
    $0 < c \leq 0.1$, and
    $0 < d \leq 0.005$.

2. The white light emitting device as claimed in claim 1, wherein the yellow phosphor comprises $Y_3Al_5O_{12}$:Ce, $Tb_3Al_5O_{12}$:Ce, $(BaSr)_2SiO_4$:Eu, or combinations thereof.

3. The white light emitting device as claimed in claim 1, wherein the phosphor has a formula:
    $(Sr_{1-c}Eu_c)_3Si_{1-d}Ge_dO_5$, and
    having an emission spectrum of 580 nm±5 nm.

4. The white light emitting device as claimed in claim 1, wherein the phosphor has a formula:
    $(Sr_{1-b-c}Tm_bEu_c)_3Si_{1-d}Ge_dO_5$,
    wherein $0 < b \leq 0.03$, and
    the phosphor has an emission spectrum of 580 nm±5 nm.

5. The white light emitting device as claimed in claim 1, wherein the phosphor has a formula:
    $(Sr_{1-a-b-c}Ba_aTm_bEu_c)_3Si_{1-d}Ge_dO_5$,
    wherein $0.1 \leq a \leq 0.5$ and $0 < b \leq 0.03$, and
    the phosphor has an emission spectrum of 600 nm±5 nm.

* * * * *